US009812996B2

(12) United States Patent
Nagai et al.

(10) Patent No.: US 9,812,996 B2
(45) Date of Patent: Nov. 7, 2017

(54) METHOD FOR CALCULATING DISTANCE, METHOD FOR NEUTRALIZING ELECTROSTATIC CHUCK, AND PROCESSING APPARATUS

(71) Applicant: TOKYO ELECTRON LIMITED, Tokyo (JP)

(72) Inventors: Kenji Nagai, Miyagi (JP); Yoshinobu Ooya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 593 days.

(21) Appl. No.: 14/542,979

(22) Filed: Nov. 17, 2014

(65) Prior Publication Data

US 2015/0162233 A1 Jun. 11, 2015

(30) Foreign Application Priority Data

Dec. 6, 2013 (JP) ................................. 2013-253271

(51) Int. Cl.
*H01L 21/683* (2006.01)
*G01B 11/14* (2006.01)
*H02N 13/00* (2006.01)

(52) U.S. Cl.
CPC ............. *H02N 13/00* (2013.01); *G01B 11/14* (2013.01); *H01L 21/6831* (2013.01)

(58) Field of Classification Search
None
See application file for complete search history.

(56) References Cited

U.S. PATENT DOCUMENTS

| 6,480,285 | B1* | 11/2002 | Hill | .......................... | G01B 9/04 |
| | | | | | 356/492 |
| 7,009,712 | B2* | 3/2006 | Hill | .......................... | G01B 9/04 |
| | | | | | 356/496 |
| 7,508,527 | B2* | 3/2009 | Hill | .......................... | G01J 9/02 |
| | | | | | 356/515 |
| 8,184,268 | B2* | 5/2012 | Seeger | .................... | G01S 13/38 |
| | | | | | 356/5.01 |
| 9,668,652 | B2* | 6/2017 | Vakoc | .................. | A61B 5/0066 |
| 2006/0152734 | A1* | 7/2006 | Suzuki | ............... | G01B 11/0675 |
| | | | | | 356/479 |

(Continued)

FOREIGN PATENT DOCUMENTS

JP 2004-40046 A 2/2004

*Primary Examiner* — Allan Olsen
(74) *Attorney, Agent, or Firm* — Rothwell, Figg, Ernst & Manbeck, P.C.

(57) ABSTRACT

There are provided a method for obtaining a distance between a base portion of an electrostatic chuck and a back surface of a target object and a method for neutralizing the electrostatic chuck based on the obtained distance. The electrostatic chuck has an upper surface including the base portion and a plurality of convex portions projecting from the base portion. The target object is mounted on apexes of the convex portions of the electrostatic chuck such that the back surface is in contact with the apexes. By processing a first wavelength spectrum output from a spectroscope based on reflected light of light emitted from a light source, a distance between the back surface of the target object and the base portion of the electrostatic chuck is calculated. Based on the calculated distance, a voltage is applied to the electrostatic chuck to neutralize the electrostatic chuck.

3 Claims, 13 Drawing Sheets

(56) References Cited

U.S. PATENT DOCUMENTS

| | | | |
|---|---|---|---|
| 2015/0162232 A1* | 6/2015 | Zhao | H01L 21/67259 361/234 |
| 2015/0168130 A1* | 6/2015 | Matsudo | H01J 37/3288 156/345.24 |
| 2016/0157828 A1* | 6/2016 | Sumi | G01N 29/0654 702/189 |
| 2016/0268099 A1* | 9/2016 | Vergeer | G01N 21/88 |

* cited by examiner

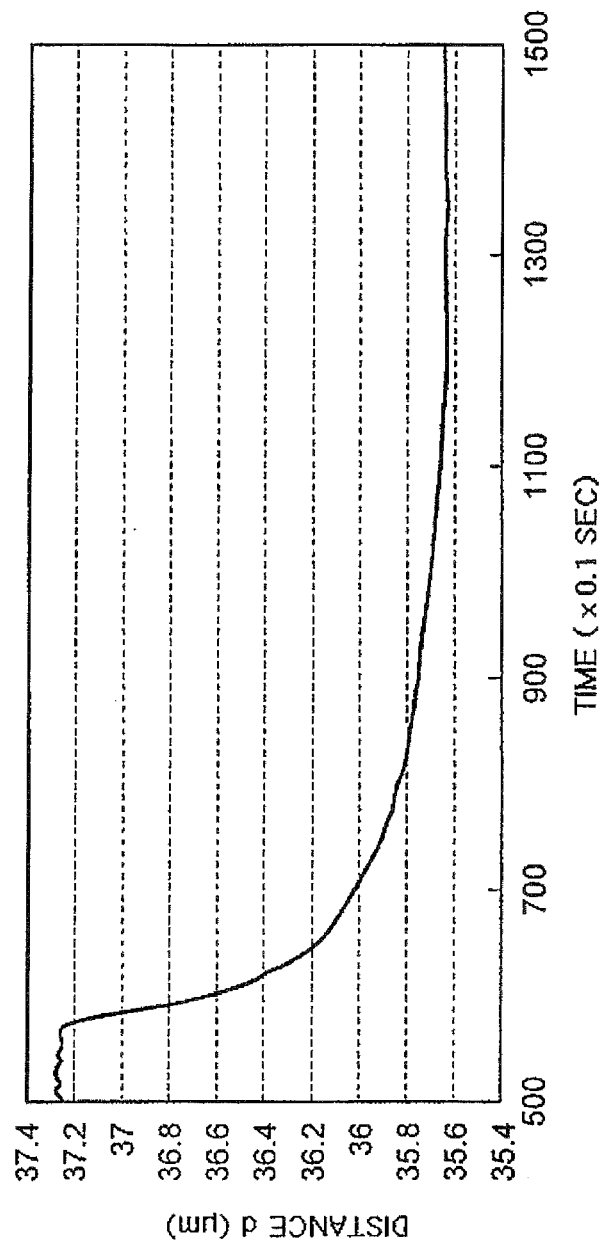

METHOD FOR CALCULATING DISTANCE, METHOD FOR NEUTRALIZING ELECTROSTATIC CHUCK, AND PROCESSING APPARATUS

CROSS-REFERENCE TO RELATED APPLICATIONS

This application claims priority to Japanese Patent Application No. 2013-253271 filed on Dec. 6, 2013, the entire contents of which are incorporated herein by reference.

FIELD OF THE INVENTION

The present invention relates to a method for calculating a distance, a method for neutralizing an electrostatic chuck, and a processing apparatus.

BACKGROUND OF THE INVENTION

In the field of manufacture of electronic devices, a plasma processing apparatus is used for processes such as etching, deposition and the like for a target object to be processed. The plasma processing apparatus includes a process container and a mounting table, for mounting thereon a target objects to be processed which is installed in the process container. The mounting table generally includes an electrostatic chuck to which a voltage is applied. The target object is attracted to and held on the electrostatic chuck by a coulomb force generated by the voltage.

In the plasma processing apparatus, the surface condition of the electrostatic chuck varies over time. For example, reaction products generated during plasma processing may be deposited, as an altered layer, on the surface of the electrostatic chuck. When the altered layer is formed on the surface of the electrostatic chuck, the surface of the electrostatic chuck may not be neutralized even after the application of the voltage is stopped. Under a state where the surface of the electrostatic chuck is electrified, if a target object is detached from the electrostatic chuck, a load may exert on the target object, which may result in misalignment or crack of the target object. Therefore, a process of neutralizing the electrostatic chuck before the target object is detached has been conventionally performed.

In order to neutralize the electrostatic chuck, a voltage having the opposite polarity to a voltage for attraction is typically applied to the electrostatic chuck. This technique is disclosed in Japanese Patent Application Publication No. 2004-40046.

However, in the technique disclosed in Japanese Patent Application Publication No. 2004-40046, it is difficult to neutralize the electrostatic chuck since it cannot correctly detect an amount of charge of the electrostatic chuck. If the electrostatic chuck cannot be neutralized, the target object may be misaligned or cracked when the target object is detached from the electrostatic chuck.

Some electrostatic chucks may have an upper surface having a base portion and a plurality of convex portions projecting from the base portion. Such an electrostatic chuck, the target object is mounted on apexes of the plurality of convex portions such that the back surface of the target object is in contact with the apexes.

The present inventors have discovered that, under the state where the target object is attracted and held on the electrostatic chuck, the back surface of the target object is elastically deformed and a distance between the back surface of the target object and the base portion of the electrostatic chuck is varied depending on an attraction force of the electrostatic chuck. Based on this discovery, the present inventors have found that the attraction force (i.e., an amount of charge) of the electrostatic chuck can be indirectly detected by calculating the distance between the back surface of the target object and the base portion of the electrostatic chuck.

SUMMARY OF THE INVENTION

According to one aspect, there is provided a method for obtaining a distance between a back surface of a target object to be processed and a base portion of an electrostatic chuck when the target object is mounted on the electrostatic chuck, wherein the electrostatic chuck has an upper surface including the base portion and a plurality of convex portions projecting from the base portion and the target object is mounted on apexes of the convex portions of the electrostatic chuck such that the back surface is in contact with the apexes. The method includes: (a) acquiring, first wavelength spectrum, with respect to intensity, of reflected light of light emitted from a light source and irradiated on the back surface of the target object and the base portion of the electrostatic chuck; (b) acquiring a second wavelength spectrum by converting the first wavelength spectrum into a wavelength spectrum of reflectivity based on a wavelength spectrum of the light emitted from the light source; (c) acquiring a first wavenumber spectrum by converting a wavelength of the second wavelength spectrum into a wavenumber; (d) acquiring a second wavenumber spectrum by interpolating the first wavenumber spectrum at regular intervals in a wavenumber direction; (e) acquiring a third wavenumber spectrum by subjecting the second wavenumber spectrum to a first correction process to equalize reflectivities of both ends of the second wavenumber spectrum in a wavenumber direction; (f) acquiring a first optical path length spectrum by subjecting the third wavenumber spectrum to fast Fourier transform; (g) acquiring a second optical path length spectrum by subjecting the first optical path length spectrum to a filtering process to remove components of an optical path length corresponding to a thickness of the target object from the first optical path length spectrum; (h) acquiring a fourth wavenumber spectrum by subjecting the second optical path length spectrum to inverse fast Fourier transform; (i) acquiring a fifth wavenumber spectrum by subjecting the fourth wavenumber spectrum to a second correction process which is an inverse of the first correction process; (j) acquiring a third wavelength spectrum by converting a wavenumber of the fifth wavenumber spectrum into a wavelength; (k) acquiring a fourth wavelength spectrum by normalizing the third wavelength spectrum by using a normalization wavelength spectrum by indicating characteristics of the spectroscope based on the light emitted from the light source; and (l) calculating the distance based on a peak wavelength or a valley wavelength in the fourth wave length spectrum.

In this method, the light emitted from the light source is reflected at a plurality of boundary surfaces such as the front surface of the target object, the back surface of the target object and the base portion of the electrostatic chuck. Rays reflected at the plurality of boundary surfaces interfere with each other. That is, the reflected rays from the plurality of boundary surfaces interfere with each other constructively or destructively depending on the wavelength. Therefore, the first wavelength spectrum output from the spectroscope has a signal intensity varying depending on the wavelength. In this method, in the step (b), by converting the first wavelength spectrum into the second wavelength spectrum, i.e., a wavelength spectrum of reflectivity, an effect of the wavelength spectrum of the light source on the first wavelength spectrum is eliminated. Next, in this method, in the step (c), the second wavelength spectrum is converted into the first wavenumber spectrum. Next, in this method, in the step (d), the second wavenumber spectrum is generated by interpolating the first wavenumber spectrum at regular intervals in the wavenumber direction. Next, in this method, as a pre-process of fast Fourier transform (FFT), in the step (e), the second wavenumber spectrum is subjected to the first correction process to equalize reflectivity of both ends of the wavenumber direction of the second wavenumber spectrum. Thus, the third wavenumber spectrum is generated. In the step (f), the third wavenumber spectrum is subjected to FFT.

The first optical path length spectrum includes components based on an optical path length longer than the optical path length between the base portion of the electrostatic chuck and the back surface of the target object, that is, components based on the optical path length between the front surface and back surface of the target object. Therefore, in this method, in the step (g), the first optical path length spectrum is subjected to the filtering process to remove components of an optical path length corresponding to a thickness of the target object. Next, in this method, in the step (h), the fourth wavenumber spectrum is generated by subjecting the second optical path length spectrum to the inverse fast Fourier transform (IFFT). Next, in this method, in the step (i), in order to alleviate an effect of the first correction process, the fifth wavenumber spectrum is generated by subjecting the fourth wavenumber spectrum to the second correction process which is an inverse of the first correction process. Next, in this method, in the step (j), the third wavelength spectrum is generated by converting the wavenumber of the fifth wavenumber spectrum into a wavelength. Next, in this method, in the step (k), the fourth wavelength spectrum is generated by normalizing the third wavelength spectrum using a normalization wavelength spectrum indicating characteristics of the spectroscope. Then, in this method, the distance between the back surface of the target object and the base portion of the electrostatic chuck is calculated based on a peak wavelength or a valley wavelength in the fourth wave length spectrum.

According to another aspect, there is provided a method for neutralizing an electrostatic chuck attracting a target object using the above-described method for obtaining the distance. The method includes: acquiring a distance between the base portion of the electrostatic chuck and the back surface of the target object by performing the above-described method for obtaining the distance; and applying a voltage to the electrostatic chuck based on the acquired distance. With this method, by obtaining the distance between the base portion of the electrostatic chuck and the back surface of the target object, it can be determined whether to neutralize the electrostatic chuck and a voltage can be applied to the electrostatic chuck. In other words, in this method, it is possible to obtain an amount of charge of the electrostatic chuck and neutralize the electrostatic chuck by calculating the distance.

According to another aspect, there is provided a processing apparatus used for processing of a target object. The apparatus includes a processing container, an electrostatic chuck, a light source, a power supply, a spectroscope and a controller. The electrostatic chuck is disposed inside the processing container. The electrostatic chuck has an upper surface including a base portion and a plurality of convex portions projecting from the base portion and configured to support a target object to be processed on apexes of the convex portions. The power supply configured to apply a voltage to the electrostatic chuck. The light source emits light irradiated on a back surface of the target object and the base portion of the electrostatic chuck between the plurality of convex portions. The spectroscope configured to receive reflected light of the light emitted from the light source and output a first wavelength spectrum with respect to intensity. The controller controls the voltage applied to the electrostatic chuck based on the first wavelength spectrum.

The controller performs a process of: (b) acquiring a second wavelength spectrum by converting the first wavelength spectrum into a wavelength spectrum of reflectivity based on a wavelength spectrum of the light emitted from the light source; (c) acquiring a first wavenumber spectrum by converting a wavelength of the second wavelength spectrum into a wavenumber; (d) acquiring a second wavenumber spectrum by interpolating the first wavenumber spectrum at regular intervals in a wavenumber direction; (e) acquiring a third wavenumber spectrum by subjecting the second wavenumber spectrum to a first correction process to equalize reflectivities of both ends of the second wavenumber spectrum in a wavenumber direction; (f) acquiring a first optical path length spectrum by subjecting the third wavenumber spectrum to fast Fourier transform; (g) acquiring a second optical path length spectrum by subjecting the first optical path length spectrum to a filtering process to remove components of an optical path length corresponding to a thickness of the target object from the first optical path length spectrum; (h) acquiring a fourth wavenumber spectrum by subjecting the second optical path length spectrum to inverse fast Fourier transform; (i) acquiring a fifth wavenumber spectrum by subjecting the fourth wavenumber spectrum to a second correction process which is an inverse of the first correction process; (j) acquiring a third wavelength spectrum by converting a wavenumber of the fifth wavenumber spectrum into a wavelength; (k) acquiring a fourth wavelength spectrum by normalizing the third wavelength spectrum by using a normalization wavelength spectrum indicating characteristics of the spectroscope based on the light emitted from the light source; (l) calculating a distance between the back surface of the target object and the base portion of the electrostatic chuck based on a peak wavelength or a valley wavelength in the fourth wavelength spectrum; and (m) controlling the power supply to apply the voltage to the electrostatic chuck based on the calculated distance.

With this processing apparatus, it is possible to neutralize the electrostatic chuck. Therefore, it is possible to prevent the workpiece from being misaligned or cracked when the workpiece is detached from the electrostatic chuck.

Advantages of the Invention

As described above, it is possible to calculate the distance between the back surface of the target object and the base portion of the electrostatic chuck and neutralize the electrostatic chuck based on the calculated distance.

BRIEF DESCRIPTION OF THE DRAWINGS

The objects and features of the present invention will become apparent from the following description of embodiments, given in conjunction with the accompanying drawings, in which:

FIG. 12 is a graph showing a result of a validation experiment performed using the processing apparatus.

DETAILED DESCRIPTION OF THE EMBODIMENTS

Figure 1:
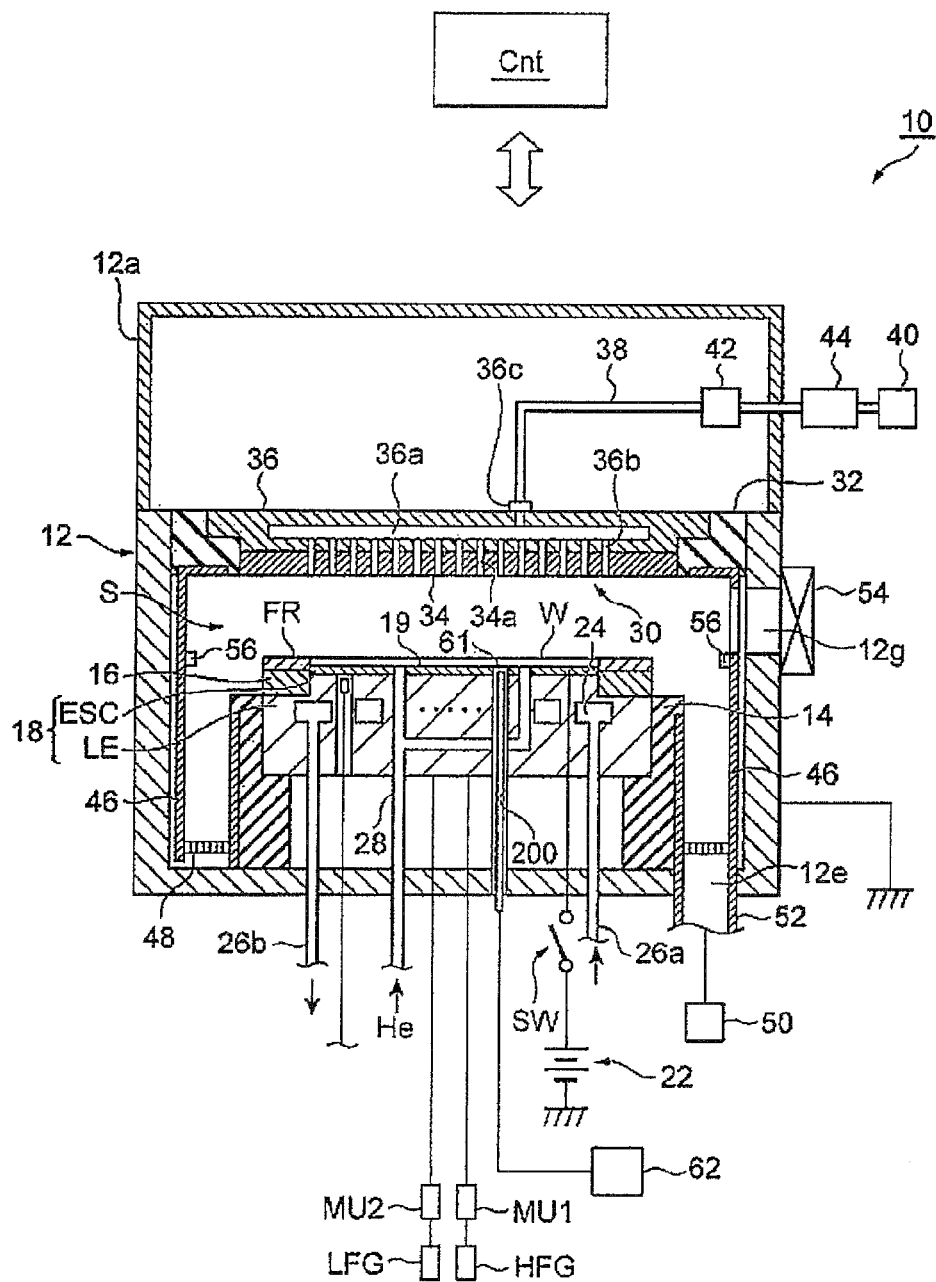
FIG. 1 is a view schematically showing a processing apparatus according to an embodiment.

Hereinafter, various embodiments of the present invention will be described in detail with reference to the accompanying drawings. Throughout the drawings, the same or similar elements are denoted by the same reference numerals.

A processing apparatus according to an embodiment will first be described. FIG. 1 is a view schematically showing a processing apparatus according to the embodiment. FIG. 1 shows a longitudinal section of a processing apparatus 10 according to the embodiment. The processing apparatus 10 shown in FIG. 1 is a capacitively-coupled plasma processing apparatus;

The processing apparatus 10 includes a processing chamber 12. The processing chamber 12 has a cylindrical shape. The processing chamber 12 has an inner surface made of anodized aluminum. The processing chamber 12 is grounded for safety.

A cylindrical support 14 made of insulating material is disposed at the low portion in the processing container 12. The support 14 extends vertically from the bottom of the processing chamber 12 inside the processing container 12. The support 14 supports a mounting table 18 provided in the processing container 12.

The mounting table 18 includes a lower electrode LE and an electrostatic chuck ESC. The lower electrode LE is made of metal such as aluminum or the like and has a disc shape. The electrostatic chuck ESC is disposed on the lower electrode LE. The electrostatic chuck ESC has a structure in which an electrode as a conductive film is interposed between a pair of insulating layers or insulating sheets. A DC power supply 22 is electrically connected to the electrode of the electrostatic chuck ESC. The electrostatic chuck ESC can attract and hold a target object to be process (hereinafter referred to as a "wafer") by an electrostatic force such as a coulomb force produced by a DC voltage from the DC power supply 22.

A spacer 16 made of insulating material is disposed on the periphery of the lower electrode LE of the mounting table 18. A focus ring FR surrounding the electrostatic chuck ESC and the periphery of the wafer W is disposed on the spacer 16. The focus ring FR is provided to improve etching uniformity. The focus ring FR is made of a material, such as quartz, appropriately selected depending on a material of a film to be etched.

A coolant flow channel 24 is formed inside the lower electrode LE. The flow channel 24 is connected to an external chiller unit through a pipe 26a and a pipe 26b. A coolant from the chiller unit is circulated through the pipe 26a, the flow channel 24 and the pipe 26b. The temperature of the wafer W supported on the mounting table 18 is controlled by controlling the temperature of the circulated coolant.

In addition, the processing apparatus 10 is provided with a gas supply line 28. The gas supply line 28 supplies a heat transfer gas (for example, He gas) from a heat transfer gas supply mechanism (not shown) into a gap between the surface of the electrostatic chuck ESC and the backside of the wafer W.

In addition, the mounting table 18 is formed with a plurality of (e.g., three) lifter pin holes 200. Lifter pins 61 are respectively disposed inside the lifter pin holes 200. The lifter pins 61 are connected to and vertically moved by a driving mechanism 62.

In addition, the processing apparatus 10 includes an upper electrode 30. The upper electrode 30 is disposed above the mounting table 18 to face the mounting table 18. The upper electrode 30 and the lower electrode LE are disposed to be substantially parallel to each other. Between the upper electrode 30 and the lower electrode LE is formed a processing space S where the wafer W is subjected to plasma processing.

The upper electrode 30 is held at the top of the processing container 12, through an insulating shield member 32. The upper electrode 30 may include an electrode plate 34 and an electrode holder 36. The electrode plate 34 faces the processing space S and is formed with a plurality of gas injection holes 34a. The electrode plate 34 may be formed of a conductor or semiconductor of low resistance and less Joule heat.

The electrode holder 36 detachably holds the electrode plate 34 and may be made of conductive material such as aluminum or the like. The electrode holder 36 may have a water-cooled structure. A gas diffusion space 36a is formed inside the electrode holder 36. A plurality of gas passage holes 36b communicating with the gas injection holes 34a extends downward from the gas diffusion space 36a. A gas inlet 36c for introducing a process gas into the gas diffusion space 36a is formed in the electrode holder 36 and is connected with a gas supply pipe 38. The gas supply pipe 38 is connected with a gas source group 40 via a valve group 42 and a flow rate controller group 44.

The processing apparatus 10 may further include a ground conductor 12a. The ground conductor 12a has a cylindrical shape and is provided to extend upward beyond the upper electrode 30 from the side wall of the processing container 12.

In addition, a deposit shield 46 is detachably disposed along the inner wall of the processing container 12. The deposit shield 46 is also disposed in the periphery of the support 14. The deposit shield 46 is provided to prevent etching by-products (deposits) from being adhered to the processing chamber 12 and may be formed by coating aluminum material with ceramics such as $Y_2O_3$ or the like.

On the bottom of the processing container 12, an exhaust plate 48 is interposed between the support 14 and the inner wall of the processing container 12. The exhaust plate 48 may be formed by coating aluminum material with ceramics such as $Y_2O_3$ or the like. An exhaust port 12e is provided in the processing chamber 12 below the exhaust plate 48. An exhaust unit 50 is connected to the exhaust port 12e through an exhaust line 52. The exhaust unit 50 has a vacuum pump such as a turbo molecular pump or the like and can decompress the interior of the processing chamber 12 to a desired degree of vacuum. A loading/unloading port 12g for the wafer W is provided in the side wall of the processing chamber 12 and can be opened/closed by a gate valve 54.

A conductive member (GND block) 56 is provided at the inner wall of the processing container 12. The conductive member 56 is attached to the inner wall of the processing chamber 12 so as to be positioned at the substantially same height as that of the wafer W in the height direction. The conductive member 56 is connected to the ground in a DC manner and exhibits an abnormal discharge prevention effect. The position of the conductive member 56 is being limited to the position shown in FIG. 1 as long as it is provided in a plasma generation region.

The processing apparatus 10 further includes a high frequency power supply unit HFG, a high frequency power supply unit LFG, a matching unit MU1 and a matching unit MU2. The high frequency generator HFG is provided to generate high frequency power for plasma generation. The high frequency generator HFG supplies high frequency power having a frequency of 27 MHz or higher, for example, 40 MHz, to the lower electrode LE via the matching unit MU1. The matching unit MU1 has a circuit for matching internal (or output) impedance of the high frequency generator HFG to load impedance. The high frequency generator LFG is provided to generate high frequency bias power for ion attraction. The high frequency generator LFG supplies high frequency bias power having a frequency of 13.56 MHz or lower, for example, 3 MHz, to the lower electrode LE via the matching unit MU2. The matching unit MU2 has a circuit for matching internal (or output) impedance of the high frequency generator LFG to load impedance.

The processing apparatus 10 may further include a controller Cnt. The controller Cnt may be implemented with a computer including a processor, a storage unit, an input device, a display and so on. The controller Cnt controls various components of the processing apparatus 10, for example, a power supply system, a gas supply system, a driving system and so on. In the controller Cnt, an operator can use the input device to input commands for management of the processing apparatus 10. The display can visualize and display the operational status. The storage unit of the controller Cnt stores control programs for control of various processes performed by the processor in the processing apparatus 10, and programs (process recipes) for causing various components of the processing apparatus to perform processes according to process conditions. The controller Cnt can also control neutralization of the electrostatic chuck ESC, as will be described later.

Figure 2:
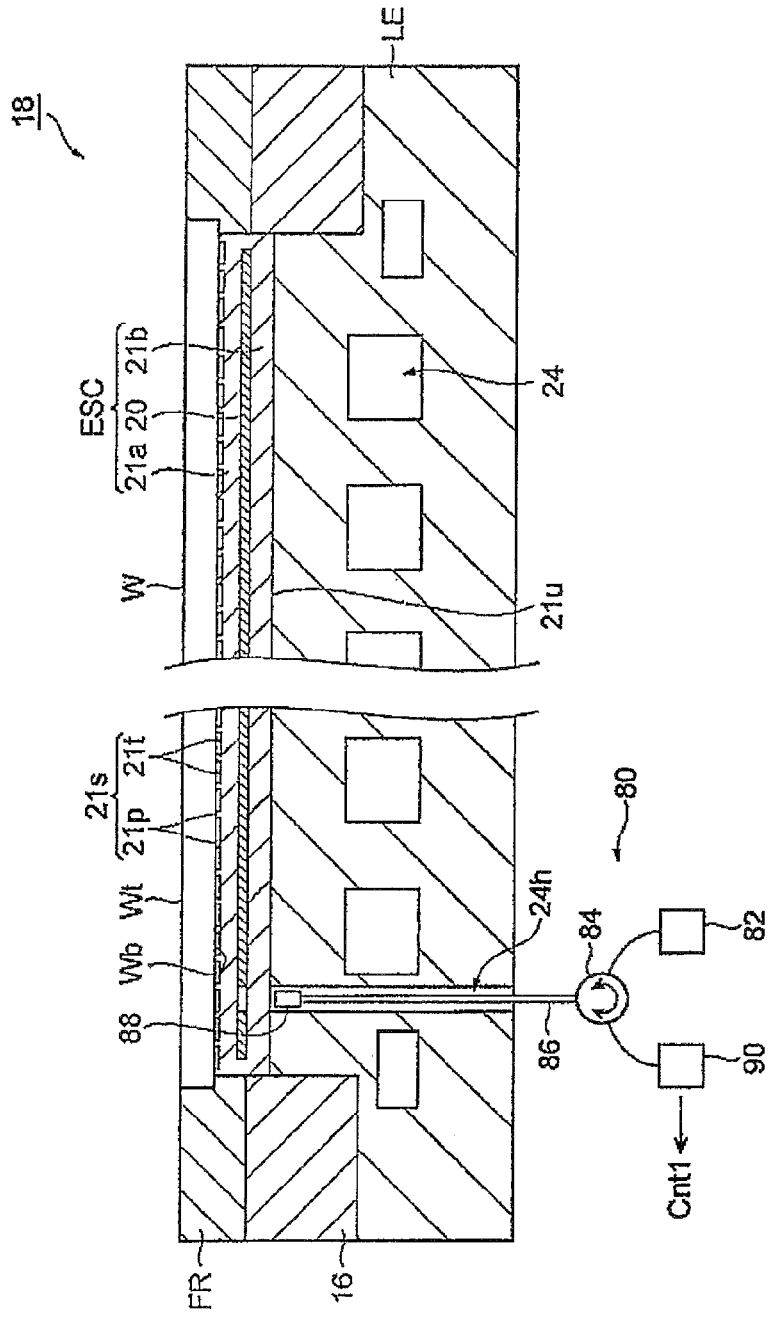
FIG. 2 is an enlarged sectional view of a mounting table of the processing apparatus according to an embodiment.

Hereinafter, the mounting table 18 will be described in detail with reference to FIG. 2. FIG. 2 is an enlarged sectional view of the mounting table 18 of the processing apparatus according to the embodiment. As described above, the mounting table 18 has the lower electrode LE and the electrostatic chuck ESC. The electrostatic chuck ESC is disposed on the lower electrode LE.

The electrostatic chuck ESC includes an insulating layer 21a, an insulating layer 21b and an electrode 20 interposed therebetween. The electrode 20 is connected with the DC power supply 22 via a switch SW. The electrostatic chuck ESC has an upper surface 21s. The surface 21s is a surface opposite to a lower surface 21u in contact with the lower electrode LE.

The surface 21s has a base portion 21t and a plurality of convex portions 21p. The plurality of convex portions 21p has a cylindrical shape and projects upward from the base portion 21t. The plurality of convex portions 21p is distributed over the surface 21s of the electrostatic chuck ESC. The wafer W is mounted on apexes of the plurality of convex portions 21s of the electrostatic chuck ESC such that the back surface Wb is in contact with the apexes.

A through-hole 24h is formed in the lower electrode LE. The through-hole 24h penetrates through the lower electrode LE in the vertical direction. The top of the through-hole 24h is located below the base portion 21t. An optical element 88 is provided inside the through-hole 24h. The optical element 88 is a part of a measuring device 80 for measuring a distance between the back surface Wb of the wafer W (i.e., a surface of the wafer W at the side of the electrostatic chuck ESC) and the base portion 21t of the electrostatic chuck ESC.

The measuring device 80 includes a light source 82, a circulator 84, an optical fiber 86, the optical element 88 and a spectroscope 90. In an embodiment, the controller Cnt also serves as a calculator of the measuring device 80. The calculator of the measuring device 80 may be a calculator other than the controller Cnt. The calculator may perform an operation for calculating a distance between the back surface Wb of the wafer W and the base portion 21t of the electrostatic chuck ESC (which will be described later) and output the calculated distance to the controller Cnt.

The light source 82 generates light for distance measurement. The light emitted from the light source 82 is irradiates to the base portion 21t of the electrostatic chuck ESC and the back surface Wb of the wafer W and transmits through the insulating layers of the electrostatic chuck ESC and the wafer W. For example, the light emitted from the light source 82 is an infrared ray having a wavelength band of 1510 nm to 1590 nm. The light emitted from the light source 82 is guided to the optical element 88 through the circulator 84 and the optical fiber 86.

The optical element 88 is a collimator or a condensing optical element. The optical element 88 converts or condenses the light from the light source 82 into parallel light. The optical element 88 outputs the light received from the light source 82 toward the lower surface 21u of the electrostatic chuck ESC. The light output from the optical element 88 transmits through the inside of the electrostatic chuck ESC to be irradiated on the back surface Wb of the wafer W through a portion between the convex portions, i.e., the base portion 21t. If the electrode 20 exists on an optical path of the light output from the optical element 88, since the light cannot arrive at the wafer W, a hole may be formed in the electrode 20 on the optical path.

The light output from the optical element 88 is reflected at the boundary surfaces such as the lower surface 21u of the electrostatic chuck ESC, the base portion 21t of the electrostatic chuck ESC, the back surface Wb of the wafer W, the top surface Wt of the wafer W and so on. In the base portion 21t of the electrostatic chuck ESC, in order to prevent the light from the optical element 88 from being scattered, at least a portion through which the light passes may be subjected to mirror finish.

A plurality of reflected rays generated by the reflection at the above-mentioned boundary surfaces is guided to the spectroscope 90 via the optical element 88, the optical fiber 86 and the circulator 84. The spectroscope 90 outputs a wavelength spectrum of the received light, i.e., a first wavelength spectrum. The plurality of reflected rays interferes with each other constructively or destructively depending on the wavelength. Therefore, the first wavelength spectrum output from the spectroscope 90 has a signal intensity varying depending on the wavelength. The first wavelength spectrum is output to the controller Cnt.

The controller Cnt calculates the distance between the back surface Wb of the wafer W and the base portion 21t of the electrostatic chuck ESC, based on a peak wavelength or valley wavelength of a wavelength spectrum obtained by processing the first wavelength spectrum, i.e., a fourth wavelength spectrum. Based on the calculated distance, the controller Cnt controls the DC power supply 22 to apply a voltage to the electrode 20 of the electrostatic chuck ESC.

When an attraction force of the electrostatic chuck ESC exerts on the wafer W, the back surface Wb of the wafer W is elastically deformed. Accordingly, the distance between the base portion 21t of the electrostatic chuck ESC and the back surface Wb of the wafer W reflects the attraction force of the electrostatic chuck ESC. Accordingly, if it is determined based on the distance of the base portion 21t of the electrostatic chuck ESC and the back surface Wb of the wafer W that the electrostatic chuck ESC generates the adsorptive force, the electrostatic chuck ESC may be neutralized to reduce the attraction force of the electrostatic chuck ESC exerting on the wafer W. Thus, it is possible to prevent the wafer W from being misaligned or cracked when the wafer W is detached from the electrostatic chuck ESC.

Hereinafter, details of the processing for the electrostatic chuck ESC in the processing apparatus 10, one embodiment of a method for neutralizing the electrostatic chuck, and one embodiment of a method for calculating a distance between the back surface of the wafer and the base portion of the electrostatic chuck will be described.

Figure 3:
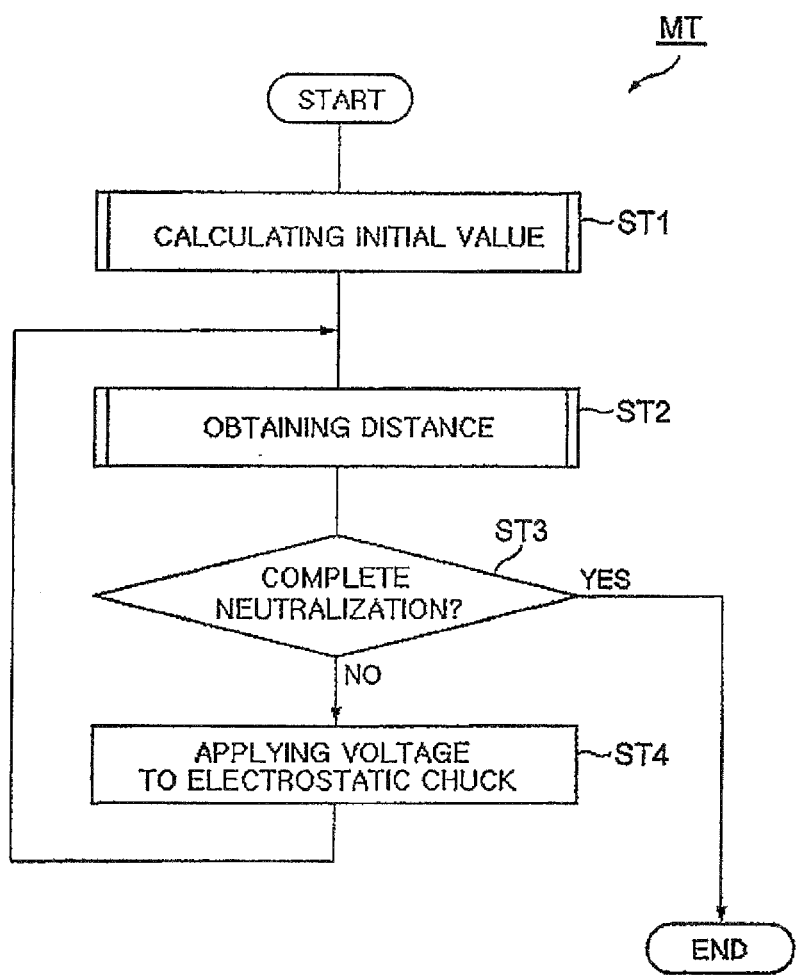
FIG. 3 is a flow chart showing the embodiment of a method for neutralizing an electrostatic chuck.

FIG. 3 is a flow chart showing the embodiment of a method for neutralizing the electrostatic chuck. The method MT shown in FIG. 3 includes Step ST2 as the embodiment of the method for calculating the distance between the back surface of the wafer and the base portion of the electrostatic chuck. In Step ST2, the distance between the back surface Wb of the wafer W and the base portion 21t of the electrostatic chuck ESC is calculated based on the following equation (1) or (2).

$$2nd = \left(m + \frac{1}{2}\right)\lambda \quad (1)$$

$$2nd = m\lambda \quad (2)$$

In Equation (1), λ represents a peak wavelength or valley wavelength, n represents a refractive index (about 1.0) of a medium between the back surface Wb of the wafer W and the base portion 21t of the electrostatic chuck ESC, d represents a distance between the back surface Wb of the wafer W and the base portion 21t of the electrostatic chuck ESC, and m represents an integer.

Figure 4:
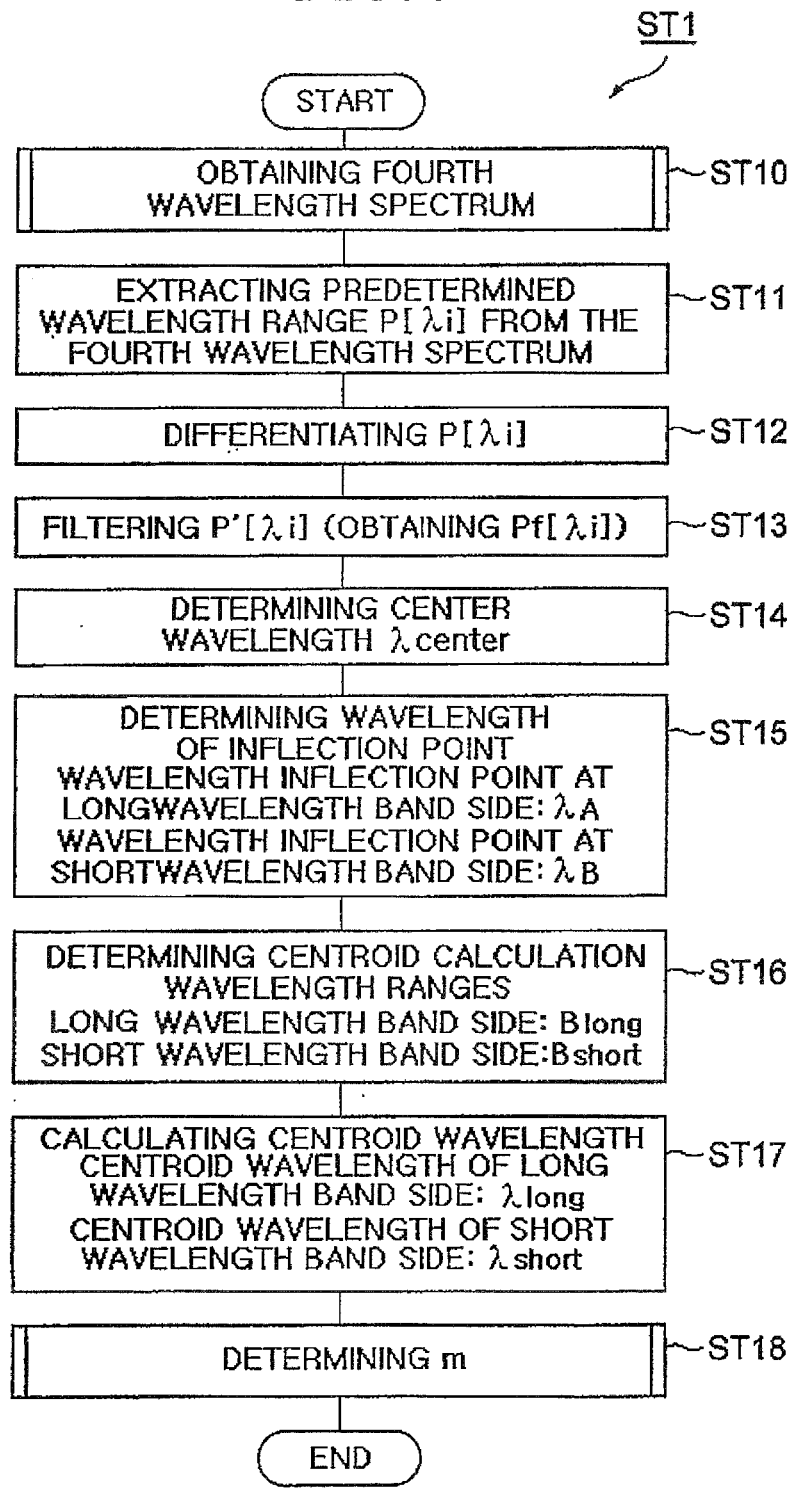
FIG. 4 is a flow chart showing details of Step ST1 shown in FIG. 3.

As shown in Eq. (1) or (2), it is necessary to determine m in order to calculate the distance d. Therefore, in the method MT, Step ST1 for calculating an initial value of m is first performed. FIG. 4 is a flow chart showing details of Step ST1. As shown in FIG. 4, Step ST1 includes Steps ST10 to ST18. In Step ST1, in order to calculate the initial value of m, the fourth wavelength spectrum is first obtained in Step ST10.

Figure 5:
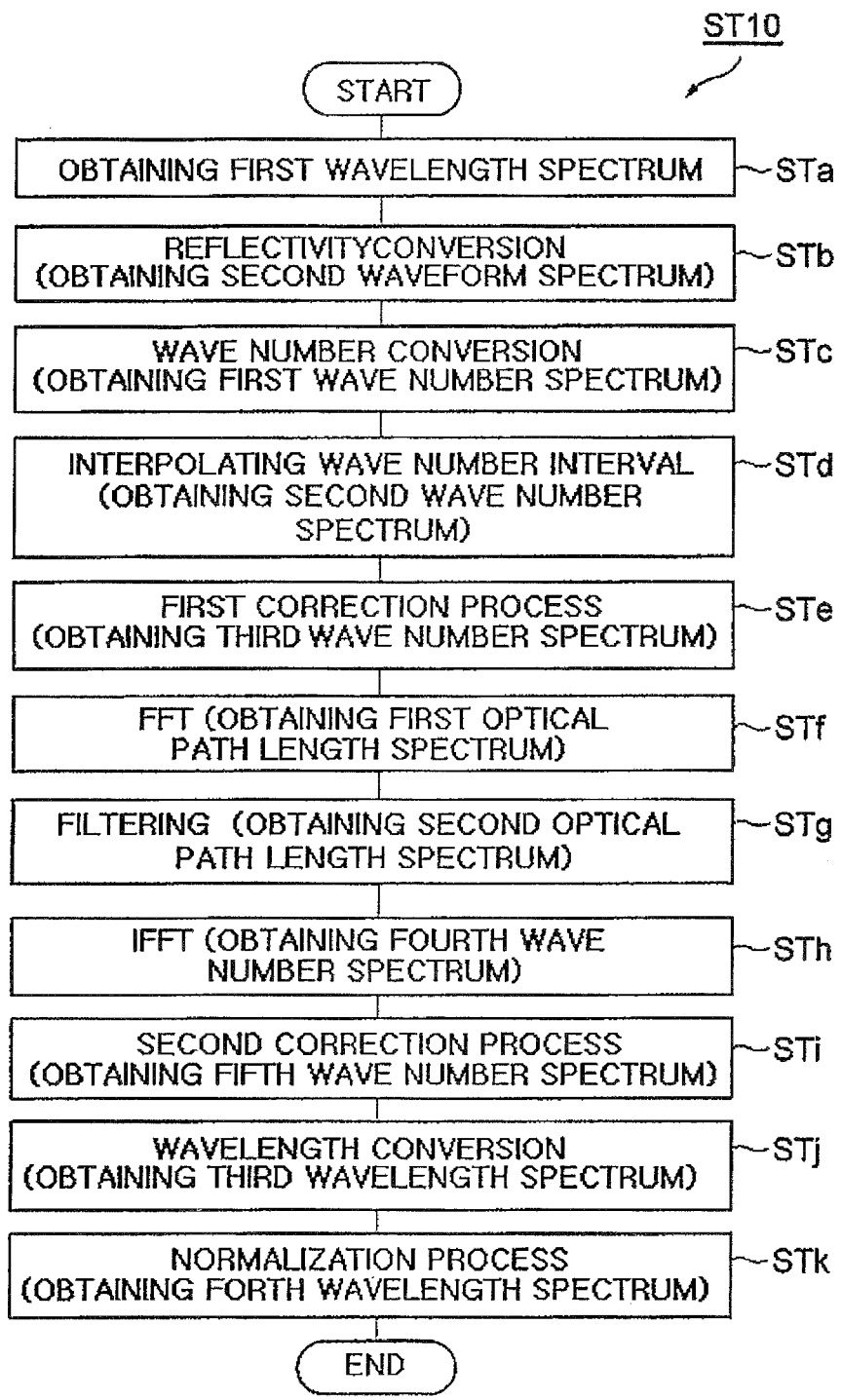
FIG. 5 is a flow chart showing details of a step for obtaining a fourth wavelength spectrum.

FIG. 5 is a flow chart showing details of a step for obtaining the fourth wavelength spectrum. As shown in FIG. 5, Step ST10 includes steps STa to STk. Hereinafter, steps STa to STk will be described with reference to FIGS. 5 to 8. FIGS. 6 to 8 are views showing a spectrum obtained in the step shown in FIG. 5.

As shown in FIG. 5, the first wavelength spectrum, with respect to intensity, is obtained in step STa. The first wavelength spectrum is a wavelength spectrum output by the spectroscope 90 of the measuring device 80. In step STa, the first wavelength spectrum output by the spectroscope 90 is received by the controller Cnt.

Figure 6A:
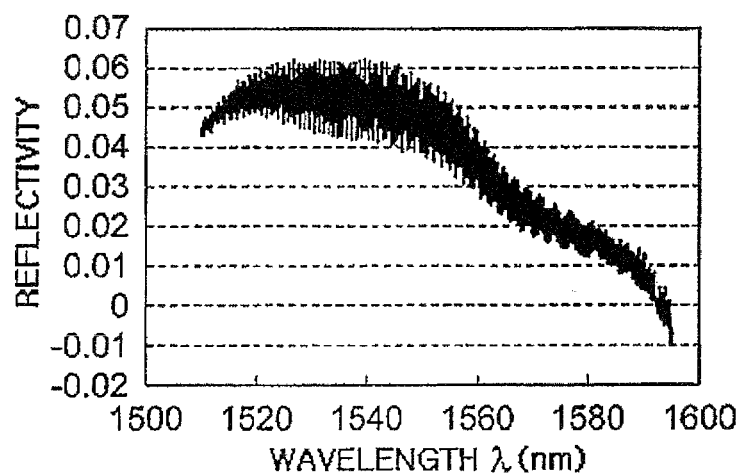
FIGS. 6A, 6B and 6C are views showing spectrums acquired in the step shown in FIG. 5.

Upon receiving the first wavelength spectrum, the controller Cnt performs steps STb to STk. Specifically, in the subsequent step STb, in order to remove an effect of wavelength spectrum of the light of the light source 82 included in the first wavelength spectrum, the first wavelength spectrum is converted into a second wavelength spectrum. The second wavelength spectrum is a wavelength spectrum of reflectivity. For example, the controller Cnt obtains by dividing the first wavelength spectrum by the wavelength spectrum of the light of the light source 82. According to step STb, the second wavelength spectrum is obtained as shown in FIG. 6A. The wavelength spectrum of the light of the light source 82 may be pre-stored in the storage unit.

Figure 6B:
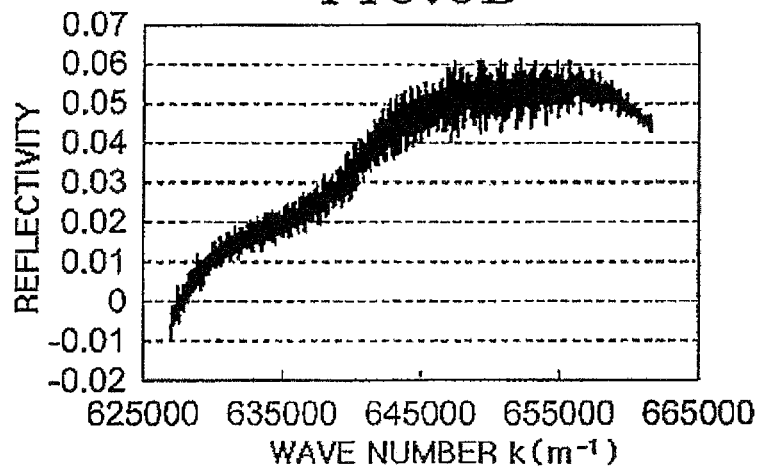

In the subsequent step STc, the wavelength of the second wavelength spectrum is converted into a wavenumber. That is, the horizontal axis of the second wavelength spectrum shown in FIG. 6A is converted into a wavenumber. According to step STc, a wavenumber spectrum as a wavenumber spectrum of reflectivity is obtained. The first wavenumber spectrum obtained according to step STc is not data sampled at the regular intervals in the wavenumber direction. Therefore, in the subsequent step STd, the first wavenumber spectrum is interpolated at the regular intervals in the wavenumber direction. As shown in FIG. 6B, a second wavenumber spectrum is generated according to step STd. For this interpolation, for example, Aitken fourth-order interpolation may be used. This interpolation is not limited to the Aitken fourth-order interpolation but may use any polynomials of any order.

Figure 6C:
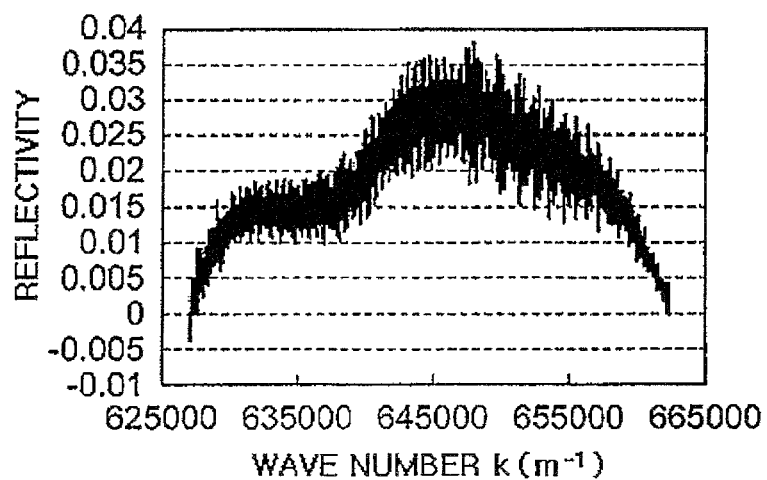

In the subsequent step STf of Step ST10, fast Fourier transformation (FFT) is applied to the wavenumber spectrum. As a pre-process for the FFT, in the subsequent step STe, a first correction process is applied to the second wavenumber spectrum in order to equalize reflectivity of both ends in the wavenumber direction of the second wavenumber spectrum. For example, linear correction is used for the first correction process. According to step STe, a third wavenumber spectrum securing continuity of both ends in the wavenumber direction is obtained as shown in FIG. 6C.

Figure 7A:
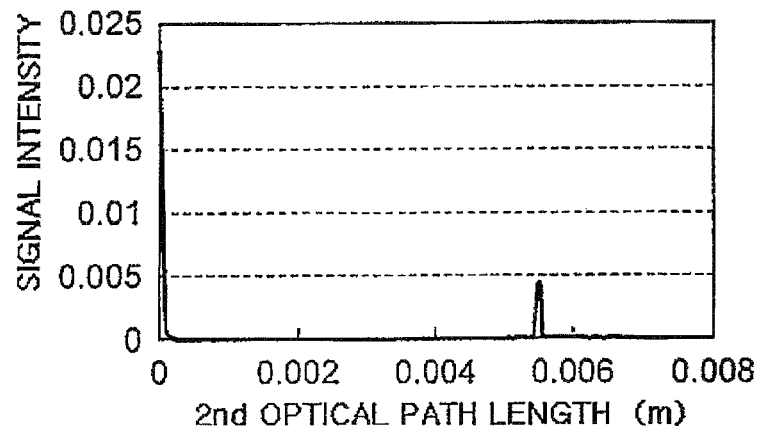
FIGS. 7A, 7B and 7C are views showing spectrums acquired in the step shown in FIG. 5.
Figure 7B:
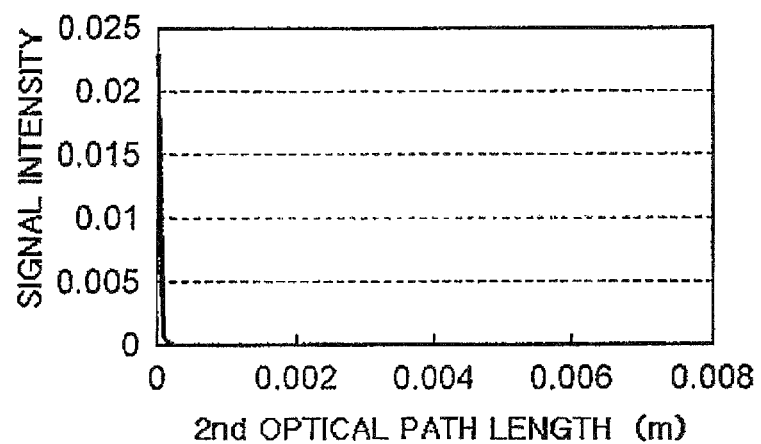

In the subsequent step STf, FFT is applied to the third wavenumber spectrum. According to step STf, a first optical path length spectrum is obtained as shown in FIG. 7A. The first optical path length spectrum includes signal intensity of an optical path length corresponding to the distance between the back surface Wb of the wafer W and the base 21t of the electrostatic chuck ESC, i.e., signal intensity based on interference between reflected rays from the back surface Wb of the wafer W and the base 21t of the electrostatic chuck ESC. The first optical path length spectrum also includes components such as signal intensity based on interference between reflected rays from the lower surface 21u of the electrostatic chuck ESC and the base portion 21t of the electrostatic chuck ESC, signal intensity based on interference between reflected rays from the upper surface Wt and the back surface Wb of the wafer W. Here, a distance between the lower surface 21u of the electrostatic chuck ESC and the base portion 21t of the electrostatic chuck ESC and a distance between the upper surface Wt and the back surface Wb of the wafer W are greater than the distance between the back surface Wb of the wafer W and the base portion 21t of the electrostatic chuck ESC. Accordingly, in the subsequent step STg, in order to remove signal intensity based on interference of reflected rays from one or more pairs of boundary surfaces having an optical path length longer than the optical path length between the back surface Wb of the wafer W and the base portion 21t of the electrostatic chuck ESC, a filtering process is applied to the first optical path length spectrum. This filtering process is a low pass filtering process. That is, this filtering process removes signal intensity of an optical path length corresponding to thickness of the wafer W while leaving signal intensity of an optical path length corresponding to the distance between the back surface Wb of the wafer W and the base portion 21t of the electrostatic chuck ESC. According to step STg, a second optical path length spectrum is obtained as shown in FIG. 7B.

Figure 7C:
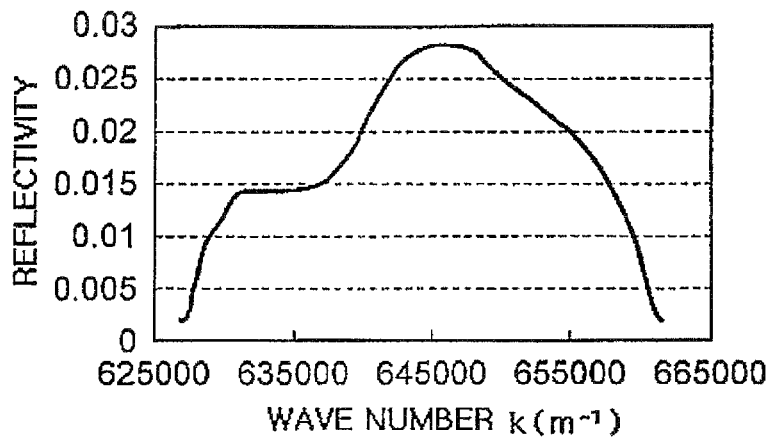
Figure 8A:
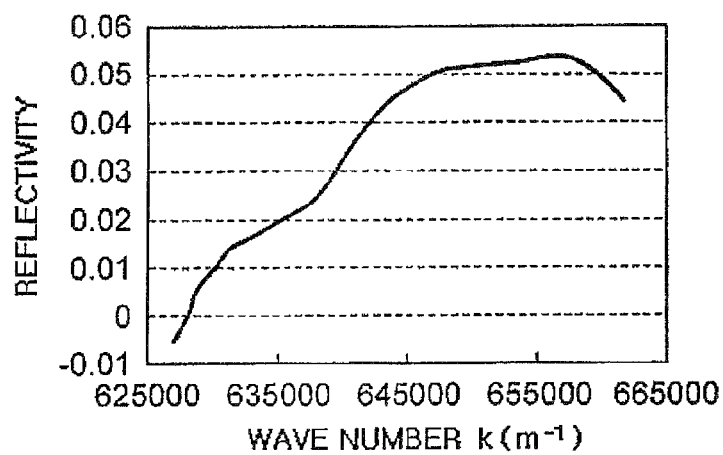
FIGS. 8A, 8B and 8C are views showing spectrums acquired in the step shown in FIG. 5.

In the subsequent step STh, inverse fast Fourier transformation (IFFT) is applied to the second optical path length spectrum. According to step STh, a fourth wavenumber spectrum is obtained as shown in FIG. 7C. In the subsequent step STi, in order to eliminate an effect of the first correction process in step STe, a second correction process is applied to the fourth wavenumber spectrum. The second correction process is an inverse of the first correction process. As one example, linear correction symmetrical with the linear correction of the first correction process is used for the second correction process. According to step STi, a fifth wavenumber spectrum is obtained as shown in FIG. 8A.

Figure 8B:
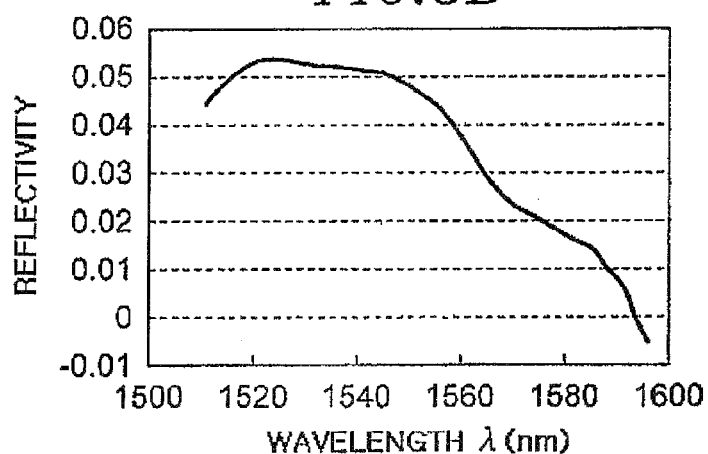
Figure 8C:
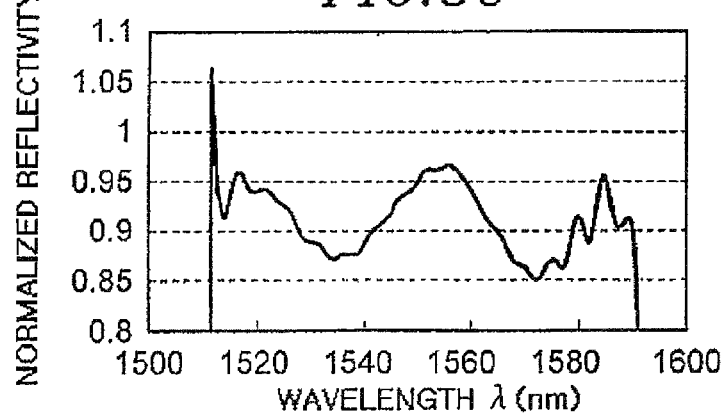

In the subsequent step STj, a wavenumber of the fifth wavenumber spectrum is converted into a wavelength. According to step STj, a third wave number spectrum is obtained as shown in FIG. 8B. A characteristic of the spectroscope 90 is reflected in the third wave number spectrum. That is, a characteristic of output of the spectroscope 90 based on a wavelength of light in reflected to the third wavelength spectrum. For this reason, in the subsequent step STk, a normalization process is applied to the third wave number spectrum. For this normalization process, the controller Cnt stores a wavelength spectrum for normalization. This normalization wavelength spectrum is generated by mounting a wafer having a metal film as an inner layer on the mounting table 18 and subjecting this wafer to the steps from step STa to step STj. The controller Cnt can obtain the fourth wavelength spectrum of normalized reflectivity, as shown in FIG. 8C, by dividing the third wave number spectrum by the normalization wavelength spectrum.

Returning back to FIG. 4, when the fourth wavelength spectrum is obtained in Step ST10, the controller Cnt calculates the initial value of m by performing Steps ST11 to ST18. In the following description, reference is made to FIGS. 9A to 9D in conjunction with FIG. 4.

Figure 9A:
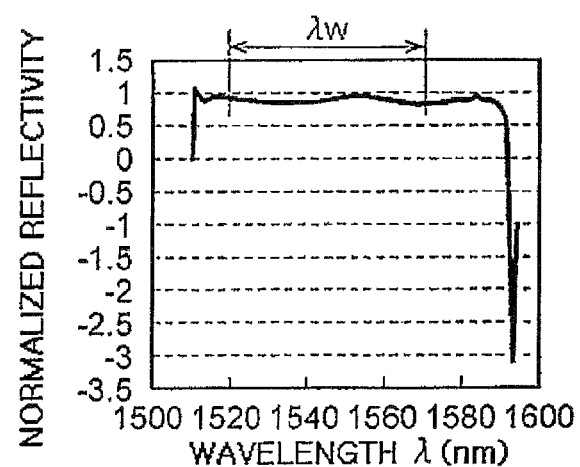
FIGS. 9A, 9B, 9C and 9D are views for explaining the step shown in FIG. 4.
Figure 9B:
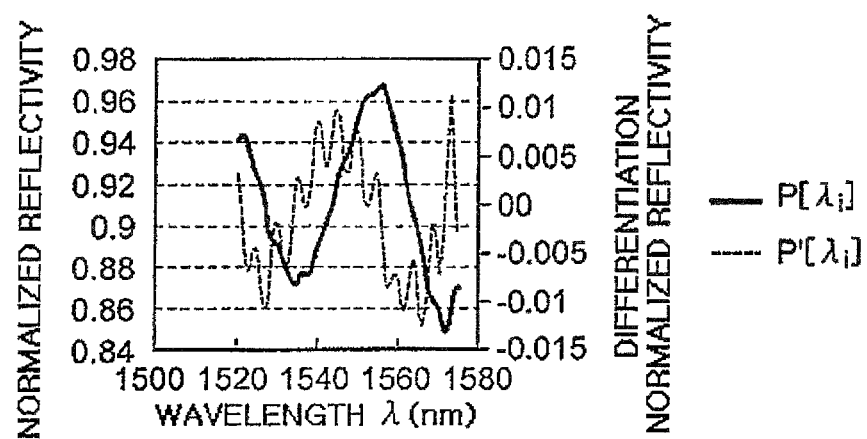

In Step ST11, as shown in FIG. 9A, a spectrum of a predetermined wavelength range λw is obtained from the fourth wavelength spectrum. The predetermined wavelength range λw is, for example, 1520 nm to 1575 nm, which is within a wavelength range of spectrum of the light of the light source 82. Hereinafter, the spectrum of the predetermined wavelength range λw within the fourth wavelength spectrum is denoted by $P[\lambda_i]$. Where, $\lambda_i$ represents a sampled wavelength, i represents an integer of 0 to N−1, and $P[\lambda_i]$ represents a normalized reflectivity at the wavelength $\lambda_i$.

In the subsequent Step ST12, a differentiation of $P[\lambda_i]$ is obtained. Specifically, a differentiation of $P[\lambda_i]$, i.e., $P'[\lambda_i]$, is obtained according to the following equation (3) (see FIG. 9B).

$$P'[\lambda_i] = \frac{P[\lambda_{i+1}] - P[\lambda_i]}{\lambda_{i+1} - \lambda_i} \quad (3)$$

Figure 9C:
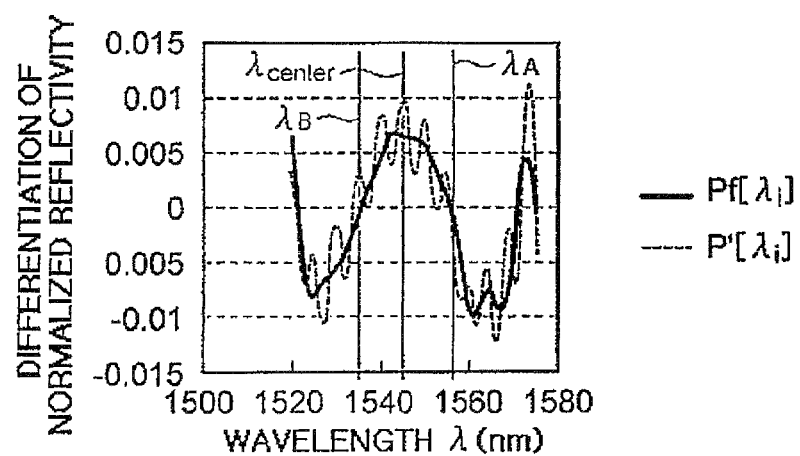
Figure 9D:
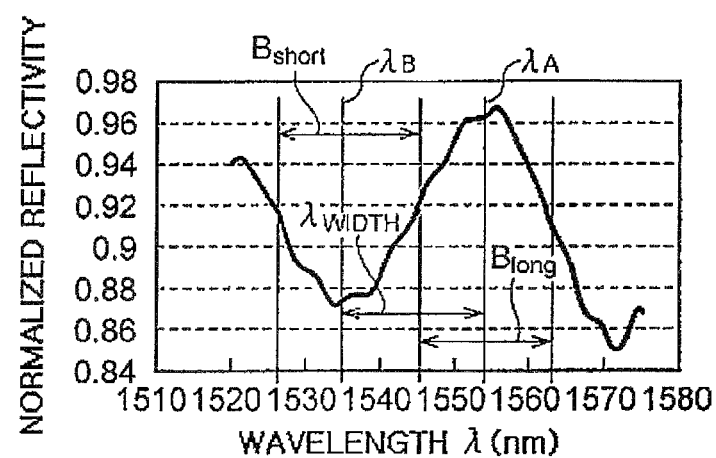

In the subsequent Step ST13, a filtering process is applied to $P'[\lambda_i]$ and $P_f[\lambda_i]$ is obtained as shown in FIG. 9C. For this filtering process, the steps from step STc to STj in FIG. 5 are applied to $P'[\lambda_i]$.

In the subsequent ST14, a center wavelength $\lambda_{center}$ is determined. Specifically, a wavelength $\lambda_i$, which is larger than and closest to the median of the wavelength range λw, is selected as the center wavelength $\lambda_{center}$ (see FIG. 9C).

In the subsequent Step ST15, for both of a long wavelength band side and a short wavelength band side with respect to the center wavelength $\lambda_{center}$ a wavelength of an inflection point of $P_f[\lambda_i]$ is determined. Specifically, $[\lambda_i]$ which makes $P_f[\lambda_i] \times P_f[\lambda_{i-1}]$ negative and makes $P_f[\lambda_{i-1}] \times P_f[\lambda_{i-2}]$ positive is searched and determined as a wavelength of an inflection point. When $P_f[\lambda_i]$ is negative, the searched wavelength $\lambda_i$ is a peak wavelength. When $P_f[\lambda_i]$ is positive, the searched wavelength $\lambda_i$ is a valley wavelength. Hereinafter, a wavelength searched in the long wavelength band side is denoted by $\lambda_A$ and a wavelength searched in the short wavelength band side is denoted by $\lambda_B$ (see FIG. 9C).

In the subsequent Step ST16, centroid calculation wavelength ranges are determined. That is, a centroid calculation wavelength range $B_{long}$ of the long wavelength band side and a centroid calculation wavelength range $B_{short}$ of the short wavelength band side are determined. Specifically, $B_{long}$ is set within a range from $\lambda_A - \lambda_{WIDTH}/2$ to $\lambda_A + \lambda_{WIDTH}/2$ and $B_{short}$ is set within a range from $\lambda_B - \lambda_{WIDTH}/2$ to $\lambda_B + \lambda_{WIDTH}/2$. $\lambda_{WIDTH}$ is a value equal to or slightly larger than the absolute value of a difference between $\lambda_A$ and $\lambda_B$.

In the subsequent Step ST17, a centroid wavelength is calculated. Specifically, for each of the centroid calculation wavelength range $B_{long}$ of the long wavelength band side and the centroid calculation wavelength range $B_{short}$ of the short wavelength band side, a centroid wavelength is calculated according to the following equation (4). More specifically, when the centroid calculation wavelength range has the peak wavelength, a centroid wavelength is calculated by using a value of P, as it is, in the equation (4). On the other hand, when the centroid calculation wavelength range has the valley wavelength, a centroid wavelength is calculated by putting $P_{reverse}$ obtained according to the following equation (5) in place of P of the equation (4). In the equation (4), M represents an integer indicating the number of samples within each centroid calculation wavelength range and S represents an index for the minimal wavelength within each centroid calculation wavelength range.

$$\lambda_{centroid} = \frac{\lambda_S P[\lambda_S] + \lambda_{S+1} P[\lambda_{S+1}] + \lambda_{S+2} P[\lambda_{S+2}] + \ldots + \lambda_{S+M-1} P[\lambda_{S+M-1}]}{\lambda_S P[\lambda_S] + \lambda_{S+1} P[\lambda_{S+1}] + \lambda_{S+2} P[\lambda_{S+2}] + \ldots + \lambda_{S+M-1} P[\lambda_{S+M-1}]} \quad (4)$$

$$P_{reverse}[\lambda_i] = |P[\lambda_A] - P[\lambda_B]| - P[\lambda_i] \quad (5)$$

Hereinafter, a centroid wavelength $\lambda_{centroid}$ obtained for the centroid calculation wavelength range $B_{long}$ of the long wavelength band side is denoted by $\lambda_{long}$ and a centroid wavelength $\lambda_{centroid}$ obtained for the centroid calculation wavelength range $B_{short}$ of the short wavelength band side is denoted by $\lambda_{short}$. With regard to determination on whether the wavelengths $\lambda_{long}$ and $\lambda_{short}$ are the peak wavelength or the valley wavelength, since a result of the determination on whether the long wavelength band side has the peak wavelength or the valley wavelength is obtained in Step ST15, in the same manner as the determination result, determination on whether the wavelength $\lambda_{long}$ is the peak wavelength or the valley wavelength can be made. If the wavelength $\lambda_{long}$ is the peak wavelength, the wavelength $\lambda_{short}$ is the valley wavelength. Conversely, if the wavelength $\lambda_{long}$ is the valley wavelength, the wavelength $\lambda_{short}$ is the peak wavelength.

Figure 10:
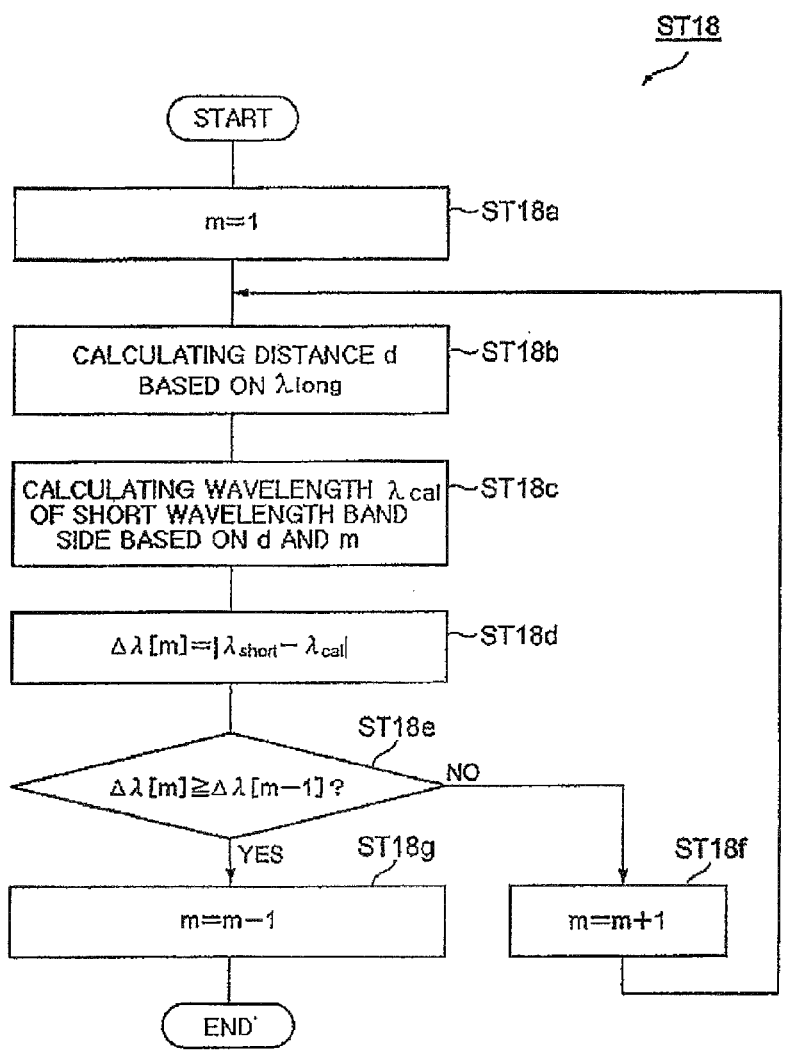
FIG. 10 is a flow chart showing details of Step ST18 shown in FIG. 4.

In the subsequent Step ST18, m is determined. FIG. 10 is a flow chart showing details of Step ST18 shown in FIG. 4. Step ST18 includes Steps ST18a to ST18g. In Step ST18a, a value of m is set to 1.

In the subsequent Step ST18b, the wavelength $\lambda_{long}$ is used to determine a distance d. Specifically, the distance d is calculated by putting the wavelength $\lambda_{long}$ in place of $\lambda$ in the equation (1) if the wavelength $\lambda_{long}$ is the peak wavelength or in the equation (2) if the wavelength $\lambda_{long}$ the valley wavelength.

In the subsequent Step ST18c, a wavelength $\lambda_{cal}$ of the short wavelength band side is calculated based on the distance d and m. Specifically, the wavelength $\lambda_{cal}$ is calculated by setting the distance d and m in the equation (2) when the equation (1) is used in Step ST18b and in the equation (1) when the equation (2) is used in Step ST18b.

In the subsequent Step ST18d, the absolute value $\Delta\lambda[m]$ of a difference between the wavelength $\lambda_{short}$ and the wavelength $\lambda_{cal}$ is calculated. Next, it is determined in Step ST18e whether $\Delta\lambda[m]$ is equal to or larger than $\Delta\lambda[m-1]$. A predetermined value is set as $\Delta\lambda[0]$.

If it is determined in Step ST18e that $\Delta\lambda[m]$ is smaller than $\Delta\lambda[m-1]$, m is incremented by 1 in Step ST18f and then the steps from Step ST18b are repeated. On the other hand, if it is determined in Step ST18e that $\Delta\lambda[m]$ is equal to or larger than $\Delta\lambda[m-1]$, in Step ST18g, m is decremented by 1 and an initial value of m is determined.

Returning back to FIG. 3, in the method MT, when the initial value of m is calculated in Step ST1, the distance d between the base portion 21t of the electrostatic chuck ESC and the back surface Wb of the wafer W is calculated in Step ST2.

Figure 11:
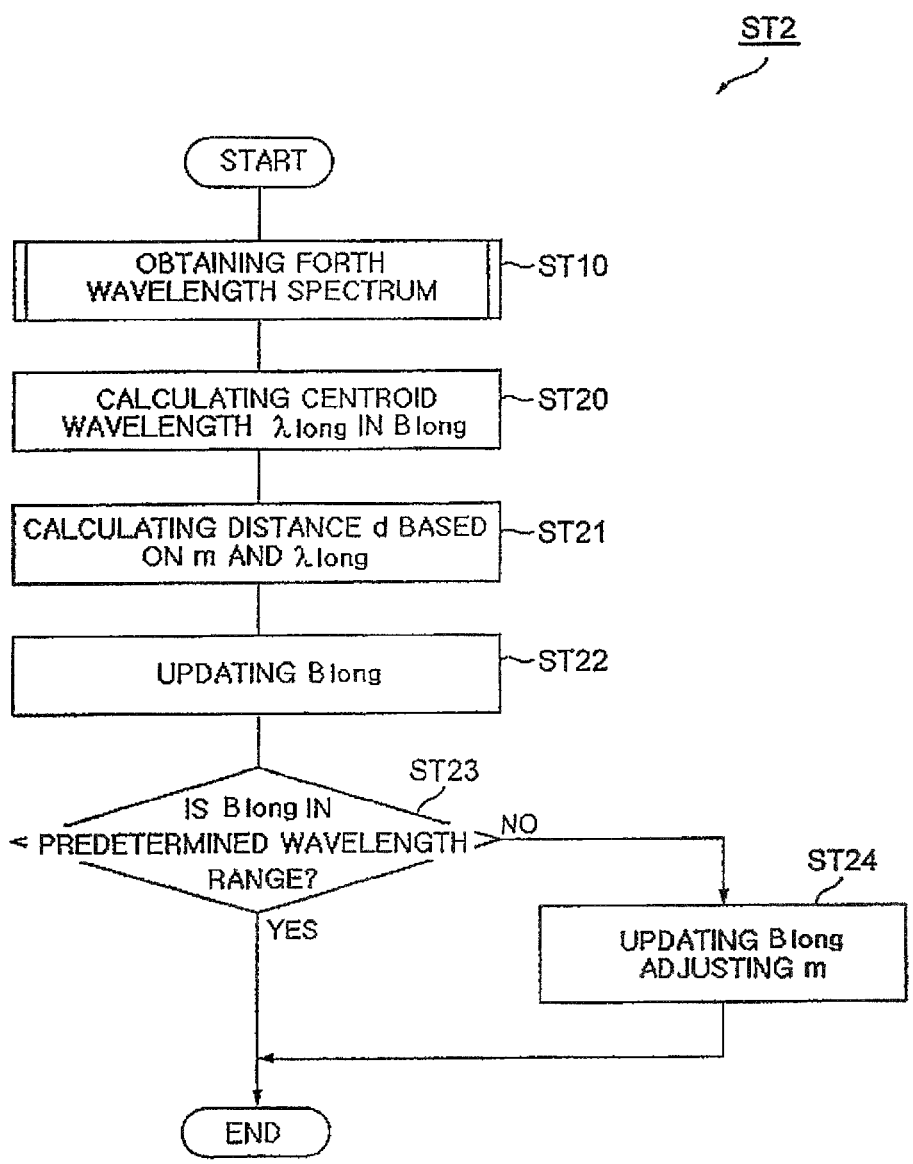
FIG. 11 is a flow chart showing details of Step ST2.

FIG. 11 is a flow chart showing details of Step ST2. As shown in FIG. 11, in Step ST2, the fourth wavelength spectrum is first obtained by Step ST10. For more information on obtaining the fourth wavelength spectrum, reference is made to FIG. 5 and the corresponding description.

Upon obtaining the fourth wavelength spectrum, the controller Cnt performs Steps ST20 to ST24. First, in Step ST20, the fourth wavelength spectrum is used to calculate the centroid wavelength $\lambda_{long}$ of the centroid calculation wavelength range $B_{long}$ of the long wavelength band side. Step ST20 is the same process as Step ST17 of FIG. 4. In the first Step ST2 of the method MT, $B_{long}$ obtained in Step ST1 is used as a wavelength range for calculation of the centroid wavelength $\lambda_{long}$. In the second and subsequent Step ST2, $B_{long}$ determined in the previous Step ST2 is used.

In the subsequent Step ST21, the distance d is calculated based on m and $\lambda_{long}$ calculated in Step ST20. In the first Step ST21, m obtained in Step ST1 is used. In the second and subsequent Step ST21, m determined in the previous Step ST2 is used. In Step ST21, for calculation of the distance d, the equation (1) is used if $\lambda_{long}$ is the peak wavelength and the equation (2) is used if $\lambda_{long}$ is the valley wavelength.

In the subsequent Step ST22, $B_{long}$ is updated. Specifically, $\Delta\lambda_{long}$ is calculated according to the following equation.

$\Delta\lambda_{long}=(\lambda_{long}$ calculated in the previous Step ST2)−
($\lambda_{long}$ calculated in the current Step ST2)

In Step ST22, $B_{long}$ is updated to a range from ($\lambda_{long}$ calculated in the previous Step ST2)−$\lambda_{WIDTH}/2-\Delta\lambda_{long}$ to ($\lambda_{long}$ calculated in the previous Step ST2)+$\lambda_{WIDTH}/2-\Delta\lambda_{long}$.

In the subsequent Step ST23, it is determined whether $B_{long}$ is within a predetermined wavelength range $\lambda w$. If $B_{long}$ is not within the predetermined wavelength range $\lambda w$, in Step ST24, $B_{long}$ and m are updated. Specifically, $B_{long}$ and m are updated according to the following Cases 1 to 4.

(Case 1)

In Case 1, $B_{long}$ is offset to the short wavelength band side and is not within the predetermined wavelength range $\lambda w$. In this case, if $\lambda_{long}$ is the peak wavelength, $\lambda_{Shift}$ is obtained based on the following equation (6) and $B_{long}$ is shifted by $\lambda_{Shift}$ to the long wavelength band side. At this time, m is not changed. A centroid wavelength calculated in updated $B_{long}$ is the valley wavelength.

$$\lambda_p = \frac{2d}{m+\frac{1}{2}} \quad (6)$$

$$\lambda_v = \frac{2d}{m}$$

$$\lambda_{Shift} = \lambda_v - \lambda_p$$

(Case 2)

In Case 2, $B_{long}$ is offset to the short wavelength band side and is not within the predetermined wavelength range $\lambda w$. In this case, if $\lambda_{long}$ is the valley wavelength, $\lambda_{shift}$ is obtained based on the following equation (7) and $B_{long}$ is shifted by $\lambda_{Shift}$ to the long wavelength band side. At this time, m is decremented by 1. A centroid wavelength calculated in updated $B_{long}$ is the peak wavelength.

$$\lambda_p = \frac{2d}{m-\frac{1}{2}} \quad (7)$$

$$\lambda_v = \frac{2d}{m}$$

$$\lambda_{Shift} = \lambda_v - \lambda_p$$

(Case 3)

In Case 3, $B_{long}$ is offset to the long wavelength band side and is not within the predetermined wavelength range $\lambda w$. In this case, if $\lambda_{long}$ is the peak wavelength, $\lambda_{Shift}$ is obtained based on the following equation (8) and $B_{long}$ is shifted by $\lambda_{Shift}$ to the short wavelength band side. At this time, m is incremented by 1. A centroid wavelength calculated in updated $B_{long}$ is the valley wavelength.

$$\lambda_p = \frac{2d}{m+\frac{1}{2}} \quad (8)$$

$$\lambda_v = \frac{2d}{m+1}$$

$$\lambda_{Shift} = \lambda_v - \lambda_p$$

(Case 4)

In Case 4, $B_{long}$ is offset to the long wavelength band side and is not within the predetermined wavelength range λw. In this case, if $\lambda_{long}$ is the valley wavelength, $\lambda_{Shift}$ is obtained based on the following equation (9) and $B_{long}$ is shifted by $\lambda_{Shift}$ to the short wavelength band side. At this time, m is not changed. A centroid wavelength calculated in updated $B_{long}$ is the peak wavelength.

$$\lambda_p = \frac{2d}{m + \frac{1}{2}} \quad (9)$$

$$\lambda_v = \frac{2d}{m}$$

$$\lambda_{Shift} = \lambda_v - \lambda_p$$

On the other hand, as a result of the determination in Step ST23, if $B_{long}$ is within the predetermined wavelength range λw, $B_{long}$ and m are not updated.

Referring to FIG. 3 again, once the distance d is calculated, the controller Cnt performs Steps ST3 to ST4. Specifically, based on the distance d obtained in the Step ST2, it is determined in Step ST3 whether the electrostatic chuck ESC has been neutralized. For example, through comparison between the distance d and a predetermined value, it is determined whether the electrostatic chuck ESC has been neutralized. If it is determined that the electrostatic chuck ESC has been neutralized, the neutralization by the method MT is completed.

On the other hand, if it is determined that the electrostatic chuck ESC has not been neutralized, that is, if it is determined that the distance d is smaller than the predetermined value, in Step ST4, a voltage is applied to the electrode 20 of the electrostatic chuck ESC. This voltage may be a voltage for neutralization. Alternatively, this voltage may be a voltage preset depending on the distance. After Step ST4, the steps from Step ST2 are repeated until the neutralization id completed.

With the above-described method MT and the processing apparatus 10 operating according to the method MT, it is possible to obtain the distance between the back surface Wb of the wafer W and the base portion 21t of the electrostatic chuck ESC based on the first wavelength spectrum output from the spectroscope 90. The obtained distance reflects an attraction force of the electrostatic chuck ESC. In other words, this distance reflects an amount of charge of the electrostatic chuck ESC. Therefore, it is possible to neutralize the electrostatic chuck ESC based on this distance. As a result, it is possible to prevent the wafer W from being misaligned or cracked when the wafer W is detached from the electrostatic chuck ESC.

Hereinafter, reference is made to FIG. 12. FIG. 12 is a graph showing a result of a validation experiment performed using the processing apparatus 10. In this experiment, a wafer was mounted on the electrostatic chuck ESC of the processing apparatus 10 and the interior of the processing chamber 12 was decompressed to a predetermined degree of vacuum. Next, the internal pressure of the processing container 12 was gradually increased to the atmospheric pressure and the distance d between the back surface of the wafer W and the base portion 21t of the electrostatic chuck ESC was obtained according to the above-described method. Even when the internal pressure of the processing chamber 12 was increased, the degree of vacuum between the wafer W and the electrostatic chuck ESC was maintained. Therefore, when the internal pressure of the processing chamber 12 was increased, a force depending on a difference in pressure between the upper surface and back surface of the wafer was applied to the wafer W toward the electrostatic chuck ESC. That is, in this experiment, the distance d was obtained using this pressure difference instead of the attraction force of the electrostatic chuck ESC. FIG. 12 shows a result of this experiment.

In FIG. 12, the horizontal axis represents time for which the internal pressure of the processing chamber 12 is increased to the atmosphere pressure and the vertical axis represents the distance d. As shown in FIG. 12, as a result of this experiment, it was confirmed that the distance d was slowly decreased with increase of the internal pressure over time. Thus, it was confirmed that the magnitude of the attraction force generated by the electrostatic chuck ESC could be indirectly obtained from the distance d. In other words, it was confirmed that an amount of charge of the electrostatic chuck ESC could be indirectly obtained from the distance d.

While various embodiments have been shown and described in the above, the present invention is not limited to the disclosed embodiments but many other modifications may be made without departing from the scope and spirit of the invention. For example, although, in the embodiment shown in FIG. 2, the optical element 88 is disposed inside the through-hole 24h near the lower surface 21u of the electrostatic chuck ESC, the optical element 88 may be disposed below the position shown in FIG. 2 or in the outside of the through-hole 24h as long as an optical path can be secured.

In addition, although, in the disclosed embodiment, the optical element 88 is disposed below the electrostatic chuck ESC and light from the light source 82 irradiates upward from below the electrostatic chuck ESC, the light from the light source 82 may irradiate downward from above the wafer W. For example, the optical element 88 may be disposed inside a hole formed in the upper electrode 30 of the processing apparatus 10.

In addition, although the above-described processing apparatus 10 is a plasma processing apparatus in which two types of high frequency powers are supplied to the lower electrode LE, the high frequency powers from the high frequency generator HFG may be applied to the upper electrode 30.

In addition, although the processing apparatus 10 is a capacitively-coupled plasma processing apparatus, the processing apparatus may have any type of plasma source. For example, the processing apparatus 10 may be an inductively-couple plasma processing apparatus or a plasma processing apparatus using a surface wave such as a microwave or the like.

While the invention has been shown and described with respect to the embodiments, it will be understood by those skilled in the art that various changes and modifications may be made without departing from the scope of the invention as defined in the following claims.

What is claimed is:

1. A method for obtaining a distance between a back surface of a target object to be processed and a base portion of an electrostatic chuck when the target object is mounted on the electrostatic chuck, wherein the electrostatic chuck has an upper surface including the base portion and a plurality of convex portions projecting from the base portion and the target object is mounted on apexes of the convex portions of the electrostatic chuck such that the back surface is in contact with the apexes, the method comprising:

acquiring, by using a spectroscope, a first wavelength spectrum, with respect to intensity, of reflected light of light emitted from a light source and irradiated on the back surface of the target object and the base portion of the electrostatic chuck;

acquiring a second wavelength spectrum by converting the first wavelength spectrum into a wavelength spectrum of reflectivity based on a wavelength spectrum of the light emitted from the light source;

acquiring a first wavenumber spectrum by converting a wavelength of the second wavelength spectrum into a wavenumber;

acquiring a second wavenumber spectrum by interpolating the first wavenumber spectrum at regular intervals in a wavenumber direction;

acquiring a third wavenumber spectrum by subjecting the second wavenumber spectrum to a first correction process to equalize reflectivities of both ends of the second wavenumber spectrum in the wavenumber direction;

acquiring a first optical path length spectrum by subjecting the third wavenumber spectrum to fast Fourier transform;

acquiring a second optical path length spectrum by subjecting the first optical path length spectrum to a filtering process to remove components of an optical path length corresponding to a thickness of the target object from the first optical path length spectrum;

acquiring a fourth wavenumber spectrum by subjecting the second optical path length spectrum to inverse fast Fourier transform;

acquiring a fifth wavenumber spectrum by subjecting the fourth wavenumber spectrum to a second correction process which is an inverse of the first correction process;

acquiring a third wavelength spectrum by converting a wavenumber of the fifth wavenumber spectrum into a wavelength;

acquiring a fourth wavelength spectrum by normalizing the third wavelength spectrum by using a normalization wavelength spectrum by indicating characteristics of the spectroscope based on the light emitted from the light source; and calculating the distance based on a peak wavelength or a valley wavelength in the fourth wave length spectrum.

2. A method for neutralizing an electrostatic chuck attracting a target object to be processed, wherein the electrostatic chuck has an upper surface including a base portion and a plurality of convex portions projecting from the base portion and the target object has a back surface and is mounted on apexes of the convex portions of the electrostatic chuck such that the back surface is in contact with the apexes, the method comprising:

acquiring a distance between the base portion of the electrostatic chuck and the back surface of the target object by performing the method of claim 1; and applying a voltage to the electrostatic chuck based on the acquired distance.

3. A processing apparatus comprising:

a processing chamber;

an electrostatic chuck disposed inside the processing chamber, wherein the electrostatic chuck has an upper surface including a base portion and a plurality of convex portions projecting from the base portion and is configured to support a target object to be processed on apexes of the convex portions;

a power supply configured to apply a voltage to the electrostatic chuck;

a light source configured to emit light to be irradiated on a back surface of the target object and the base portion of the electrostatic chuck;

a spectroscope configured to receive reflected light of the light emitted from the light source and output a first wavelength spectrum with respect to intensity; and a controller configured to control the voltage applied to the electrostatic chuck based on the first wavelength spectrum, wherein the controller is configured to perform processes of:

acquiring a second wavelength spectrum by converting the first wavelength spectrum into a wavelength spectrum of reflectivity based on a wavelength spectrum of the light emitted from the light source;

acquiring a first wavenumber spectrum by converting a wavelength of the second wavelength spectrum into a wavenumber;

acquiring a second wavenumber spectrum by interpolating the first wavenumber spectrum at regular intervals in a wavenumber direction;

acquiring a third wavenumber spectrum by subjecting the second wavenumber spectrum to a first correction process to equalize reflectivities of both ends of the second wavenumber spectrum in the wavenumber direction;

acquiring a first optical path length spectrum by subjecting the third wavenumber spectrum to fast Fourier transform;

acquiring a second optical path length spectrum by subjecting the first optical path length spectrum to a filtering process to remove components of an optical path length corresponding to a thickness of the target object from the first optical path length spectrum;

acquiring a fourth wavenumber spectrum by subjecting the second optical path length spectrum to inverse fast Fourier transform;

acquiring a fifth wavenumber spectrum by subjecting the fourth wavenumber spectrum to a second correction process which is an inverse of the first correction process;

acquiring a third wavelength spectrum by converting a wavenumber of the fifth wavenumber spectrum into a wavelength;

acquiring a fourth wavelength spectrum by normalizing the third wavelength spectrum by using a normalization wavelength spectrum indicating characteristics of the spectroscope based on the light emitted from the light source;

calculating a distance between the back surface of the target object and the base portion of the electrostatic chuck based on a peak wavelength or a valley wavelength in the fourth wavelength spectrum; and controlling the power supply to apply the voltage to the electrostatic chuck based on the calculated distance.

* * * * *